US010271470B2

(12) United States Patent
Sano

(10) Patent No.: US 10,271,470 B2
(45) Date of Patent: Apr. 23, 2019

(54) LINEAR MOTION DEVICE AND ELECTRONIC COMPONENT MOUNTING APPARATUS

(71) Applicant: Panasonic Intellectual Property Management Co., Ltd., Osaka (JP)

(72) Inventor: Tatsuya Sano, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 15/916,318

(22) Filed: Mar. 9, 2018

(65) Prior Publication Data

US 2018/0199475 A1 Jul. 12, 2018

Related U.S. Application Data

(63) Continuation of application No. 14/803,932, filed on Jul. 20, 2015, now Pat. No. 9,949,419.

(30) Foreign Application Priority Data

Aug. 29, 2014 (JP) .................................. 2014-175253

(51) Int. Cl.
    *H05K 13/04* (2006.01)
    *B25J 5/04* (2006.01)
    *B25J 9/00* (2006.01)
    *B25J 9/02* (2006.01)

(52) U.S. Cl.
    CPC ............ *H05K 13/0404* (2013.01); *B25J 5/04* (2013.01); *B25J 9/0012* (2013.01); *B25J 9/026* (2013.01); *H05K 13/0406* (2018.08)

(58) Field of Classification Search
    CPC ........ B23P 19/002; B23P 19/007; H05K 3/30; H05K 3/301; H05K 3/341
    See application file for complete search history.

(56) References Cited

U.S. PATENT DOCUMENTS

| 5,203,061 A | 4/1993 | Hamada |
| 5,509,193 A | 4/1996 | Nuxoll |

(Continued)

FOREIGN PATENT DOCUMENTS

| CN | 104080326 A | 10/2014 |
| JP | 2008-108949 A | 5/2008 |

(Continued)

OTHER PUBLICATIONS

English Translation of Chinese Search Report dated Dec. 28, 2018 for the related Chinese Patent Application No. 201510445675.1.

*Primary Examiner* — Carl J Arbes

(74) *Attorney, Agent, or Firm* — Pearne & Gordon LLP

(57) ABSTRACT

A linear motion device includes: a linear motion mechanism having: a beam elongated in one horizontal direction; a guide member disposed in the beam to extend in the one direction; a moving member disposed to be movable along the guide member; and a moving mechanism that moves the moving member. The beam includes a metallic tubular body formed with an opening portion penetrating the metallic tubular body in the one direction and a tubular reinforcing portion formed of a carbon fiber reinforced plastic and formed in close contact with an inner surface of the metallic tubular body.

14 Claims, 6 Drawing Sheets

(56) References Cited

U.S. PATENT DOCUMENTS

| | | | |
|---|---|---|---|
| 5,743,001 A * | 4/1998 | Baker | H05K 13/0408 |
| | | | 29/721 |
| 5,940,303 A * | 8/1999 | Sakai | H01L 21/67727 |
| | | | 324/750.05 |
| 6,568,069 B1 | 5/2003 | Melf et al. | |
| 6,938,328 B2 | 9/2005 | Mehdianpour et al. | |
| 7,036,213 B2 | 5/2006 | Kabeshita et al. | |
| 7,353,594 B2 | 4/2008 | Yoshida et al. | |
| 8,091,216 B2 | 1/2012 | Saho | |
| 2006/0236530 A1 | 10/2006 | Andersch | |

FOREIGN PATENT DOCUMENTS

| | | |
|---|---|---|
| JP | 2012-129317 A | 7/2012 |
| JP | 2013-206934 A | 10/2013 |
| JP | 2014-192526 A | 10/2014 |
| KR | 10-1109766 B1 | 2/2012 |

\* cited by examiner

LINEAR MOTION DEVICE AND ELECTRONIC COMPONENT MOUNTING APPARATUS

CROSS-REFERENCES TO RELATED APPLICATION(S)

This is a continuation of U.S. patent application Ser. No. 14/803,932 filed on Jul. 20, 2015 which is the application is based on and claims priority from Japanese Patent Application No. 2014-175253 filed on Aug. 29, 2014, the entire contents of which are incorporated herein by reference.

BACKGROUND

1. Field of the Invention

One or more embodiments of the present invention relate to a linear motion device that allows a slider to be movable in a beam extension direction and an electronic component mounting apparatus that is provided with the linear motion device.

2. Description of Related Art

In the field of electronic component mounting, there is an electronic component mounting apparatus that mounts a component on a substrate by using a mounting head which is movable in a horizontal direction by a linear motion device. A linear motion device configured to include a metallic (for example, iron or aluminum) beam that extends in one horizontal direction and move the mounting head along the beam by driving a movement mechanism such as a linear motor and a feed screw mechanism is used as the linear motion device.

In recent years, a faster mounting head movement and a higher level of mounting head positioning accuracy have been required for the purpose of productivity and mounting quality improvement. Beam rigidity enhancement and beam weight reduction have been in progress in order to meet these demands. As an example thereof, a beam configured to be molded into a tubular shape and formed of carbon fiber reinforce plastic (CFRP) has been proposed (for example, refer to Patent Documents 1 and 2 below). The CFRP is a composite material that is obtained by impregnating a carbon fiber with a polymer material such as an epoxy resin and then performing curing and molding thereon. The CFRP has a high level of strength and has a much lower level of specific gravity in comparison to a metal such as iron and aluminum, and thus is appropriate as a beam material.

Patent Document 1 is JP-A-2008-108949, and Patent Document 2 is JP-A-2013-206934.

SUMMARY

However, it is impractical to mold an entire beam with the CFRP because the CFRP is costly. In addition, it is difficult to perform boring and tapping for screw hole formation on the CFRP and a special tool is required for the processing, which results in higher costs, although a metallic guide member that constitutes the linear motion device needs to be fixed to the beam by a screw or the like.

An object of the embodiments of the present invention is to provide a linear motion device provided with a beam with which processing for the formation of a screw hole or the like can be easily performed while a carbon fiber reinforced plastic is used and an electronic component mounting apparatus provided with the linear motion device.

A linear motion device according to the embodiments includes a linear motion mechanism including: a beam elongated in one horizontal direction, a guide member disposed in the beam to extend in the one direction, a moving member disposed to be movable along the guide member, and a moving mechanism that moves the moving member, in which the beam includes a metallic tubular body formed with an opening portion penetrating the metallic tubular body in the one direction and a tubular reinforcing portion formed of a carbon fiber reinforced plastic and formed in close contact with an inner surface of the metallic tubular body.

An electronic component mounting apparatus according to the embodiments includes an XY movement mechanism configured of a first linear motion mechanism and second linear motion mechanism, the first linear motion mechanism including a beam elongated in one horizontal direction, a guide member disposed in the beam to extend in the one direction, a moving member disposed to be movable along the guide member, and a moving mechanism that moves the moving member, the second linear motion mechanism moving the first linear motion mechanism in a horizontal direction orthogonal to the one direction, and a mounting head attached to the moving member, in which in the electronic component mounting apparatus, the mounting head holding an electronic component is positioned with respect to a substrate by the XY movement mechanism, and the electronic component is mounted on the substrate by the positioned mounting head, and the beam includes a metallic tubular body formed with an opening portion penetrating the metallic tubular body in the one direction and a tubular reinforcing portion formed of a carbon fiber reinforced plastic and formed in close contact with an inner surface of the metallic tubular body.

According to the embodiments, a beam to which processing for forming a screw hole or the like can be easily performed with a carbon fiber reinforced plastic used in the beam can be obtained.

DETAILED DESCRIPTION

First Embodiment

Figure 1:
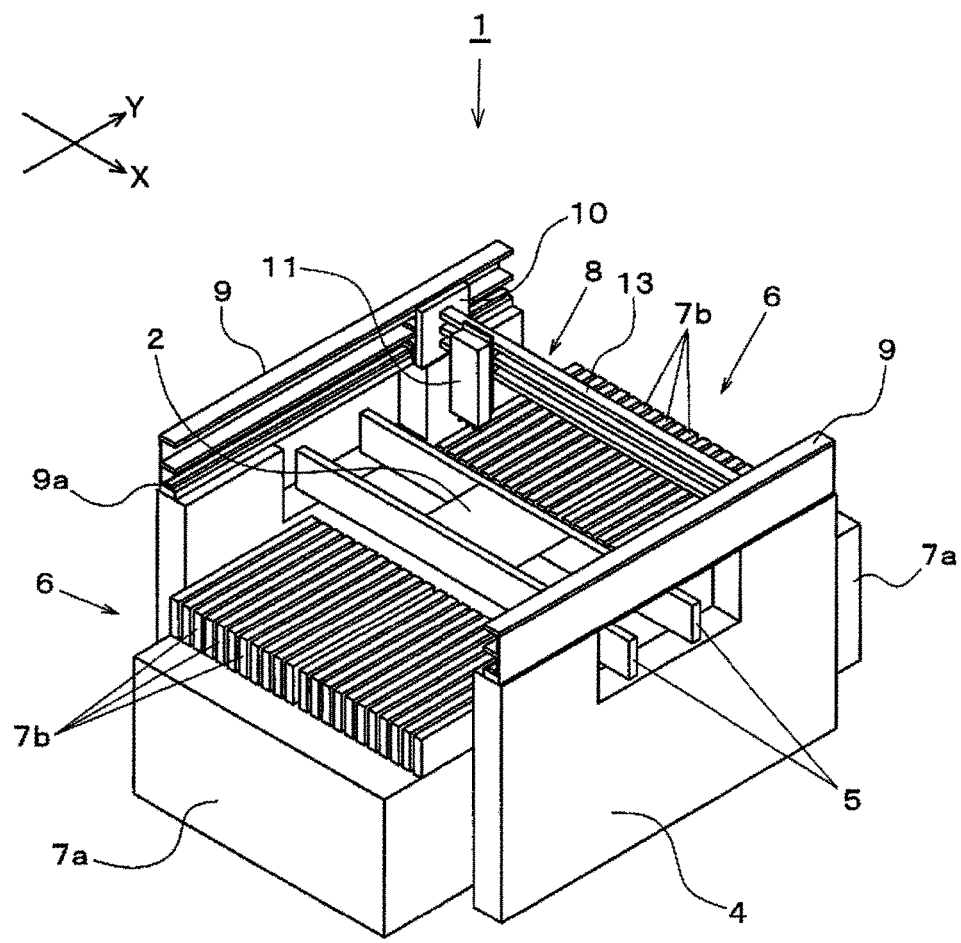
FIG. 1 is a perspective view of an electronic component mounting apparatus according to a first embodiment of the present invention.
Figure 2:
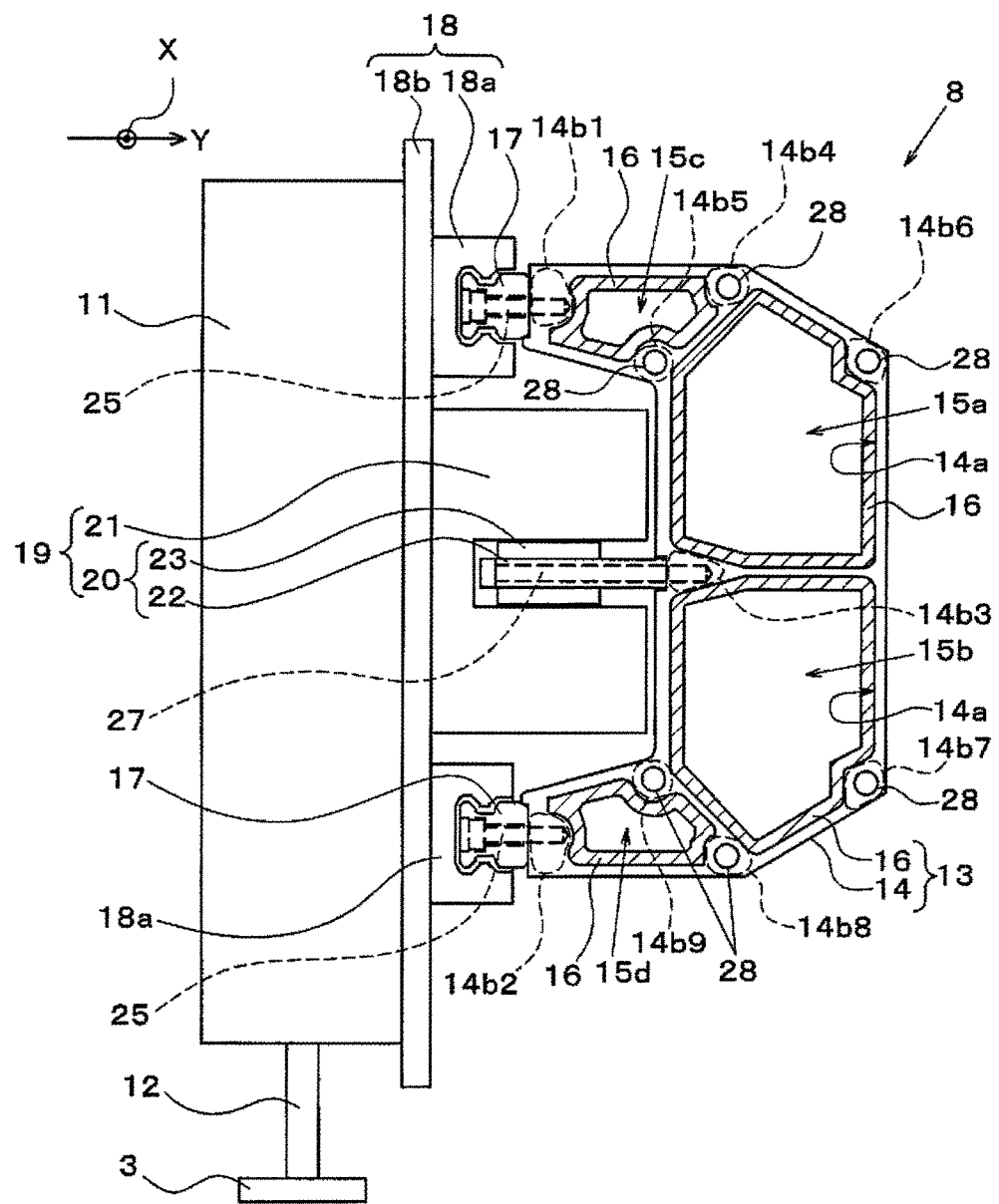
FIG. 2 is an explanatory drawing of the structure of a first linear motion mechanism that is provided in the electronic component mounting apparatus according to the first embodiment of the present invention.

Hereinafter, an electronic component mounting apparatus 1 according to a first embodiment of the present invention will be described with reference to FIGS. 1 and 2. The electronic component mounting apparatus 1 functions to mount an electronic component 3 (FIG. 2) on a substrate 2. Hereinafter, a direction in which the substrate 2 is transported will be defined as an X direction and the direction that is orthogonal to the X direction in a horizontal plane will be defined as a Y direction.

A substrate transport mechanism 5, which is provided with a pair of transport conveyors that extend in the X direction, is disposed in a central portion of a base 4. The substrate transport mechanism 5 transports the substrate 2 for positioning at a predetermined mounting operation position. A component supply unit 6 is arranged on each of both sides of the substrate transport mechanism 5. A carriage 7a that is arranged on each of both sides of the base 4 and a plurality of tape feeders 7b that are attached to the carriage 7a constitute the component supply unit 6. The tape feeders 7b supply the electronic component 3 to the position of component pickup by a mounting head 11 (described later) by pitch-feeding a carrier tape (not illustrated) holding the electronic component 3.

A first linear motion mechanism 8 (linear motion device) is disposed above the base 4. The first linear motion mechanism 8 is supported, via joint brackets 10, by Y-axis moving tables 9 that are disposed in both X-direction side portions of the base 4. The Y-axis moving table 9 is provided with a linear drive mechanism and has a guide member 9a extending in the Y direction. A slider that is provided in the joint bracket 10 is attached, to be movable in the Y direction, on the guide member 9a. The Y-axis moving table 9 is a second linear motion mechanism that moves the first linear motion mechanism 8 in the horizontal direction (Y direction) which is orthogonal to one direction (X direction).

The mounting head 11 is attached, to be movable in the X direction, to the first linear motion mechanism 8. The first linear motion mechanism 8 and the second linear motion mechanisms constitute an XY movement mechanism that moves the mounting head 11 in the X direction and the Y direction. The mounting head 11 is provided with an adsorption nozzle 12 (FIG. 2). The mounting head 11 adsorbs and picks up the electronic component 3 supplied to the component pickup position by using the adsorption nozzle 12. The XY movement mechanism positions the mounting head 11 holding the electronic component 3 with respect to the substrate 2. Then, the mounting head 11 mounts the electronic component 3 on the substrate 2. In this manner, the electronic component mounting apparatus 1 positions the mounting head 11 holding the electronic component 3 with respect to the substrate 2 by the XY movement mechanism and mounts the electronic component 3 on the substrate by using the positioned mounting head 11.

Hereinafter, the structure of the first linear motion mechanism 8 will be described with reference to FIG. 2. The first linear motion mechanism 8 is provided with an elongated beam 13 that extends in one horizontal direction (X direction in FIGS. 1 and 2), guide members 17 that are attached to the beam 13, a moving member 18 that is disposed to be movable along the guide members 17, and a linear motor 19 that moves the moving member 18. A metallic tubular body 14 and tubular reinforcing portions 16 that reinforce the metallic tubular body 14 constitute the beam 13. The tubular body 14 has an elongated tubular shape in the X direction and is provided with a first opening portion 15a, a second opening portion 15b, a third opening portion 15c, and a fourth opening portion 15d that penetrate the tubular body 14 in the X direction. The tubular body 14 has a substantially U-shaped cross section. The tubular body 14 is metallic. For example, iron and aluminum constitute the tubular body 14.

The opening portions 15a to 15d are formed to serve the purpose of reducing the weight of the beam 13. In this first embodiment, the first opening portion 15a and the second opening portion 15b are formed side by side in the vertical direction. The third opening portion 15c and the fourth opening portion 15d are formed at the positions of an upper portion and a lower portion of the substantially U-shaped tubular body 14, which extend in the horizontal direction, respectively. An opening area of the first opening portion 15a and an opening area of the second opening portion 15b are set to be substantially equal to each other. An opening area of the third opening portion 15c and an opening area of the fourth opening portion 15d are set to be substantially equal to each other. The opening areas of the first opening portion 15a and the second opening portion 15b are set to exceed the opening areas of the third opening portion 15c and the fourth opening portion 15d. The tubular body 14 according to this first embodiment is provided with the four opening portions. However, the number of opening portions of the tubular body 14 is not limited thereto. For example, the tubular body 14 may have one opening portion.

Hereinafter, the tubular reinforcing portions 16 will be described. The tubular reinforcing portions 16 are formed in close contact with inner surfaces 14a of the tubular body 14. The tubular reinforcing portions 16 are formed of a carbon fiber reinforced plastic. The carbon fiber reinforced plastic (CFRP) is known as a material having a high level of strength and having a much lower level of specific gravity in comparison to a metal such as iron and aluminum. When the tubular reinforcing portions 16 are formed of the carbon fiber reinforced plastic, an increase in weight that is attributable to the tubular reinforcing portions 16 can be suppressed to a low level. In addition, the wall thickness of the tubular body 14 can be reduced by the same amount as the tubular body 14 is reinforced, the use of a high-specific gravity metal in the tubular body 14 can be reduced, and the weight of the tubular body 14 can be reduced to substantially offset the increase in weight that is attributable to the tubular reinforcing portions 16. As a result, it is possible to allow the entire beam 13 to achieve a significant weight reduction along with a level of rigidity at least equal to those of metallic beams according to the related art.

The tubular reinforcing portions 16 are formed by an internal pressure molding method. The internal pressure molding method is a method in which a carbon fiber reinforced plastic sheet is arranged along the inner surface 14a of the tubular body 14 in a state where the carbon fiber reinforced plastic sheet is wound around the outer circumference of a core material, the core material is thermally expanded through heating so that the carbon fiber reinforced plastic sheet is pressed to the inner surface 14a, and the carbon fiber reinforced plastic sheet is thermally cured to be formed into a tubular shape. In this manner, the tubular reinforcing portions 16 in close contact with the inner surfaces 14a can be simply formed. Ideally, the tubular reinforcing portions 16 are in close contact with the entire inner surfaces 14a. However, an intended rigidity is not impaired, even in the presence of a part that is not in close contact for manufacturing convenience, if the tubular reinforcing portions 16 are in close contact with the majority of the inner surfaces 14a.

In this first embodiment, an example is described in which the tubular reinforcing portions 16 are formed on all of the inner surfaces 14a corresponding to the opening portions 15a to 15d. However, the tubular reinforcing portion 16 may be formed only on the inner surface 14a of a required opening portion. Manufacturing costs can be reduced when the tubular reinforcing portion 16 is formed only for a predetermined opening portion because the carbon fiber reinforced plastic is expensive. For example, the tubular reinforcing portions 16 disposed in the third opening portion 15c and the fourth opening portion 15d, which have a small area, are expected to make little contribution to the improvement of the rigidity of the beam 13. Accordingly, the tubular reinforcing portions 16 may be formed only on the inner surfaces 14a corresponding to the first opening portion 15a and the second opening portion 15b, which have relatively large opening areas, so that the rigidity can be enhanced and economic advantages can be achieved at the same time.

Referring back to the tubular body 14, thick portions 14b, where the thickness of the tubular body 14 is partially increased for assembly and machining convenience, are disposed in the tubular body 14 although the overall thickness (wall thickness) of the tubular body 14 is reduced for weight reduction. In other words, the tubular body 14 has thin portions and the thick portions 14b. In FIG. 2, only the thick portions 14b are illustrated by dashed lines. The tubular body 14 according to this first embodiment has a first thick portion 14b1 and a second thick portion 14b2 at the positions of the tips of the upper portion and the lower portion of the substantial U-shape, which extend in the horizontal direction, on the attaching side for the mounting head 11, respectively. In addition, the tubular body 14 has a third thick portion 14b3 at a substantially intermediate position (position between the first opening portion 15a and the second opening portion 15b) on the attaching side for the mounting head 11. In addition, the tubular body 14 has a fourth thick portion 14b4, a fifth thick portion 14b5, a sixth thick portion 14b6, a seventh thick portion 14b7, an eighth thick portion 14b8, and a ninth thick portion 14b9 at predetermined positions. Screw holes that are used to attach various members (described later) to the beam 13 are formed, through processes such as boring and tapping, in the thick portions 14b1 to 14b9.

The metallic guide members 17 are attached, in parallel to one direction (longitudinal direction of the beam 13), on the positions of the tubular body 14 corresponding to the first thick portion 14b1 and the second thick portion 14b2. Sliders 18a are disposed on the guide members 17 to be movable in the X direction along the guide members 17. A flat plate-shaped plate member 18b is fixed to the sliders 18a. The sliders 18a and the plate member 18b constitute the moving member 18, and the mounting head 11 is attached to the moving member 18.

Hereinafter, the linear drive mechanism (moving mechanism) that moves the mounting head 11 in the X direction will be described. The linear drive mechanism is configured to include a stator 20 that is disposed on the beam 13 side and a mover 21 that is disposed on the mounting head 11 side. The stator 20 is attached to a position corresponding to the third thick portion 14b3 of the tubular body 14. The stator 20 is configured to include a flat plate-shaped iron plate member 22 that is parallel to the guide members 17 and a magnet member 23 that is arranged on the surface of the iron plate member 22. The mover 21 is attached to the plate member 18b. The mover 21 has a substantially U-shaped cross section and surrounds the stator 20 at a slight distance. When a magnetic flux is generated with a coil embedded in the mover 21 electrified, the attractive and repulsive forces that act between the mover 21 and the magnet member 23 cause propulsion to be generated in the mover 21. This propulsion allows the mounting head 11 to be moved along the guide members 17. The stator 20 and the mover 21, which constitute the linear motor 19, are serving as a moving mechanism that moves the moving members 18 in the X direction. Instead of the linear motor, a feed screw, a belt, or the like may be used as the moving mechanism. As described above, the first linear motion mechanism 8 has the beam 13, the guide members 17, the moving members 18, and the moving mechanism.

Figure 3A:
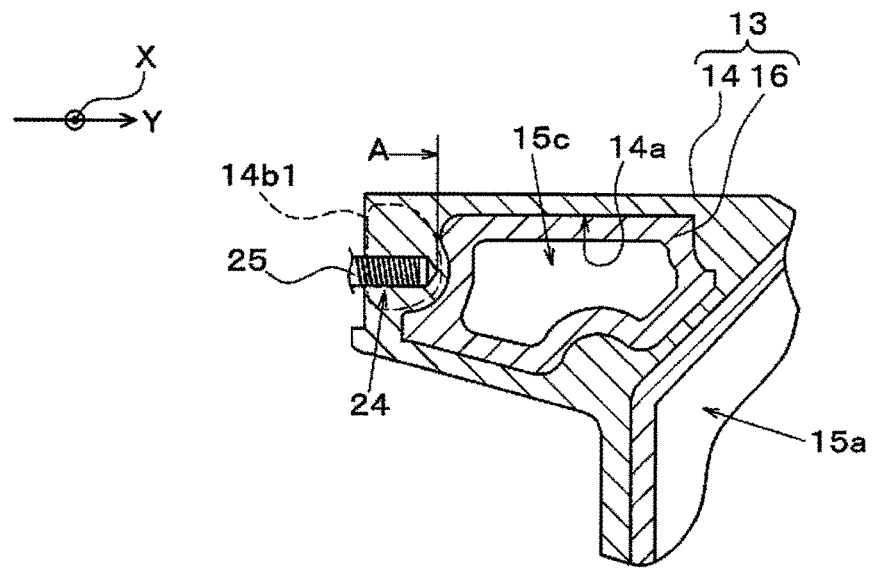
FIGS. 3A and 3B are explanatory drawings of a structure for fixing a guide member and a beam constituting the first linear motion mechanism that is provided in the electronic component mounting apparatus according to the first embodiment of the present invention.
Figure 3B:
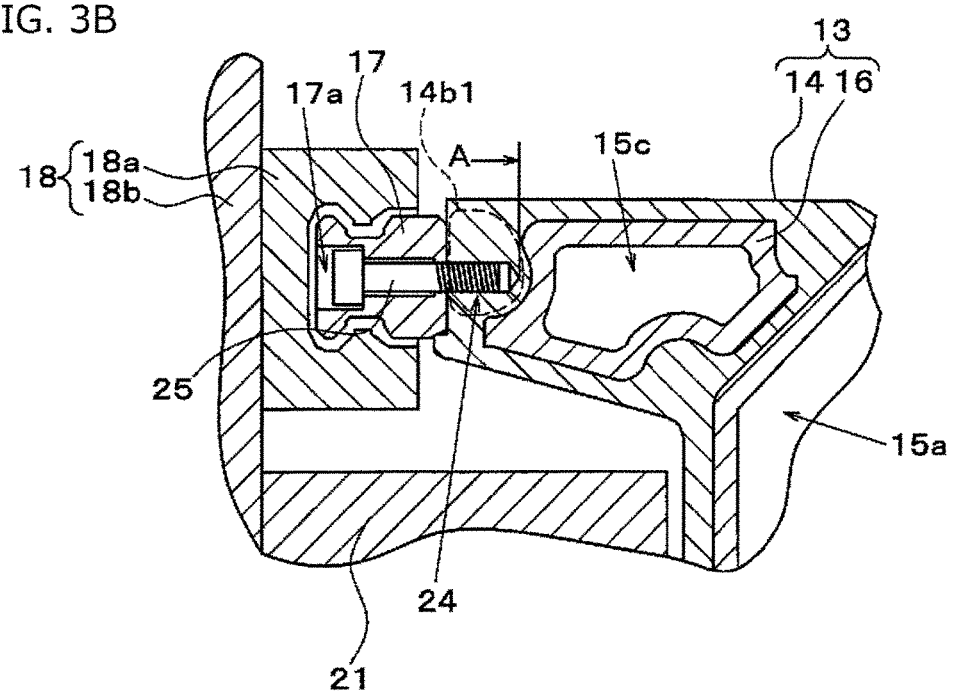

Hereinafter, a structure for fixing the guide members 17 to the beam 13 will be described with reference to FIGS. 2 to 3B. Although only the first thick portion 14b1 is illustrated in FIGS. 3A and 3B, the same description is applied to the second thick portion 14b2 as well. According to FIG. 3A, a screw hole 24 that has a screw groove is formed in the first thick portion 14b1 through processes such as boring and tapping. Since the tubular body 14 is metallic, the tapping or the like can be easily performed. The bottom portion A of the screw hole 24 in FIG. 3A does not reach (penetrate) the tubular reinforcing portion 16 of the adjacent third opening portion 15c. In other words, the screw hole 24 has a bottom. The same description is applied to the site between the screw hole 24 and the tubular reinforcing portion 16 of the fourth opening portion 15d on the second thick portion 14b2 side.

According to FIG. 3B, an insertion hole 17a for the insertion of a first screw member 25 is formed in the guide member 17. The guide member 17 is fixed to the tubular body 14 when the first screw member 25 is screwed with the screw hole 24 via the insertion hole 17a.

Figure 4A:
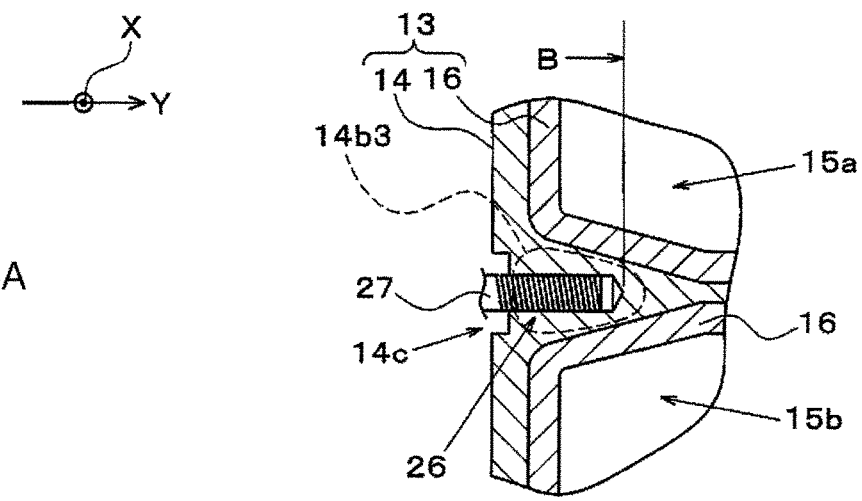
FIGS. 4A and 4B are explanatory drawings of a structure for fixing a stator and the beam constituting the first linear motion mechanism that is provided in the electronic component mounting apparatus according to the first embodiment of the present invention.

Hereinafter, a structure for fixing the stator 20 to the beam 13 will be described with reference to FIGS. 4A and 4B. A screw hole 26 that has a screw groove is formed in the third thick portion 14b3. The bottom portion B of the screw hole 26 in FIG. 4A is set at a position avoiding the first opening portion 15a and the second opening portion 15b. In other words, the screw hole 26 also has a bottom and does not reach any of the tubular reinforcing portions 16. In addition, a concave portion 14c that has a width corresponding to the thickness t (FIG. 4B) of the iron plate member 22 is formed at a position corresponding to the third thick portion 14b3 on the surface of the tubular body 14.

Figure 4B:
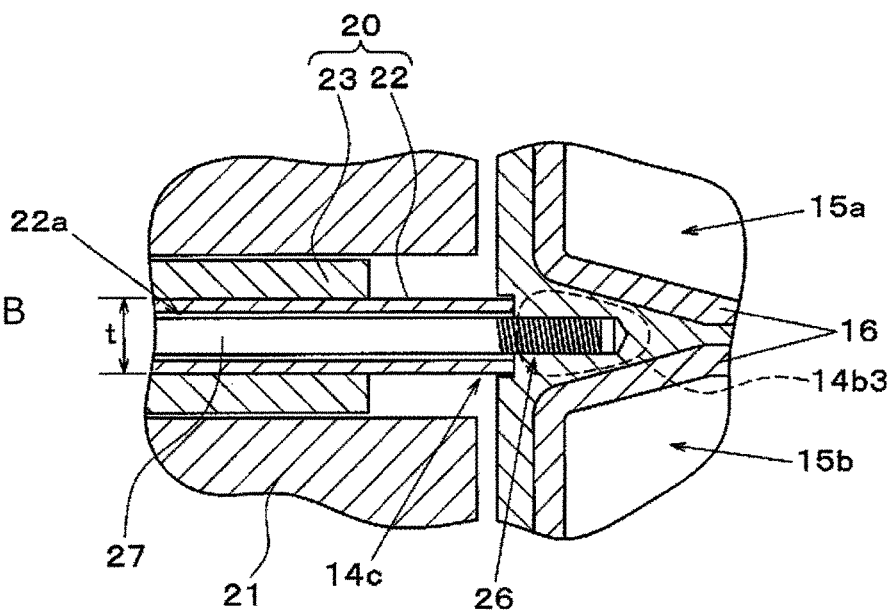

According to FIG. 4B, an insertion hole 22a for the insertion of a second screw member 27 is formed in the iron plate member 22. The stator 20 is fixed to the tubular body 14 when the second screw member 27 is screwed with the screw hole 26 via the insertion hole 22a in a state where the tip portion of the iron plate member 22 is fitted into the concave portion 14c.

Hereinafter, a structure for fixing the first linear motion mechanism 8 to the joint brackets 10 will be described with reference to FIG. 2. In the tubular body 14, screw holes 28 are formed at respective positions corresponding to the fourth thick portion 14b4 to the ninth thick portion 14b9. In the joint brackets 10, insertion holes for the insertion of a third screw member (not illustrated) are formed at positions corresponding to the fourth thick portion 14b4 to the ninth thick portion 14b9. The first linear motion mechanism 8 is fixed to the joint brackets 10 when the third screw member is screwed with the screw holes 28 via the insertion holes of the joint brackets 10.

In the beam 13 according to this first embodiment, the tubular reinforcing portions 16 formed of the carbon fiber reinforced plastic are formed in close contact with the inner surfaces 14a of the tubular body 14 as described above. Accordingly, the beam 13 to which the processing for screw hole formation can be easily performed with the tubular reinforcing portions 16 used can be obtained. Various types of processing other than tapping may be carried out for the tubular body 14.

Second Embodiment

Hereinafter, a first linear motion mechanism 8A according to a second embodiment of the present invention will be described with reference to FIG. 5. The same reference numerals (or the same reference numerals to which "A" is added) will be used to refer to those members common to the first linear motion mechanism 8 according to the first embodiment, and description thereof will be omitted. This second embodiment has a different moving mechanism configuration in comparison to the first embodiment.

Figure 5:
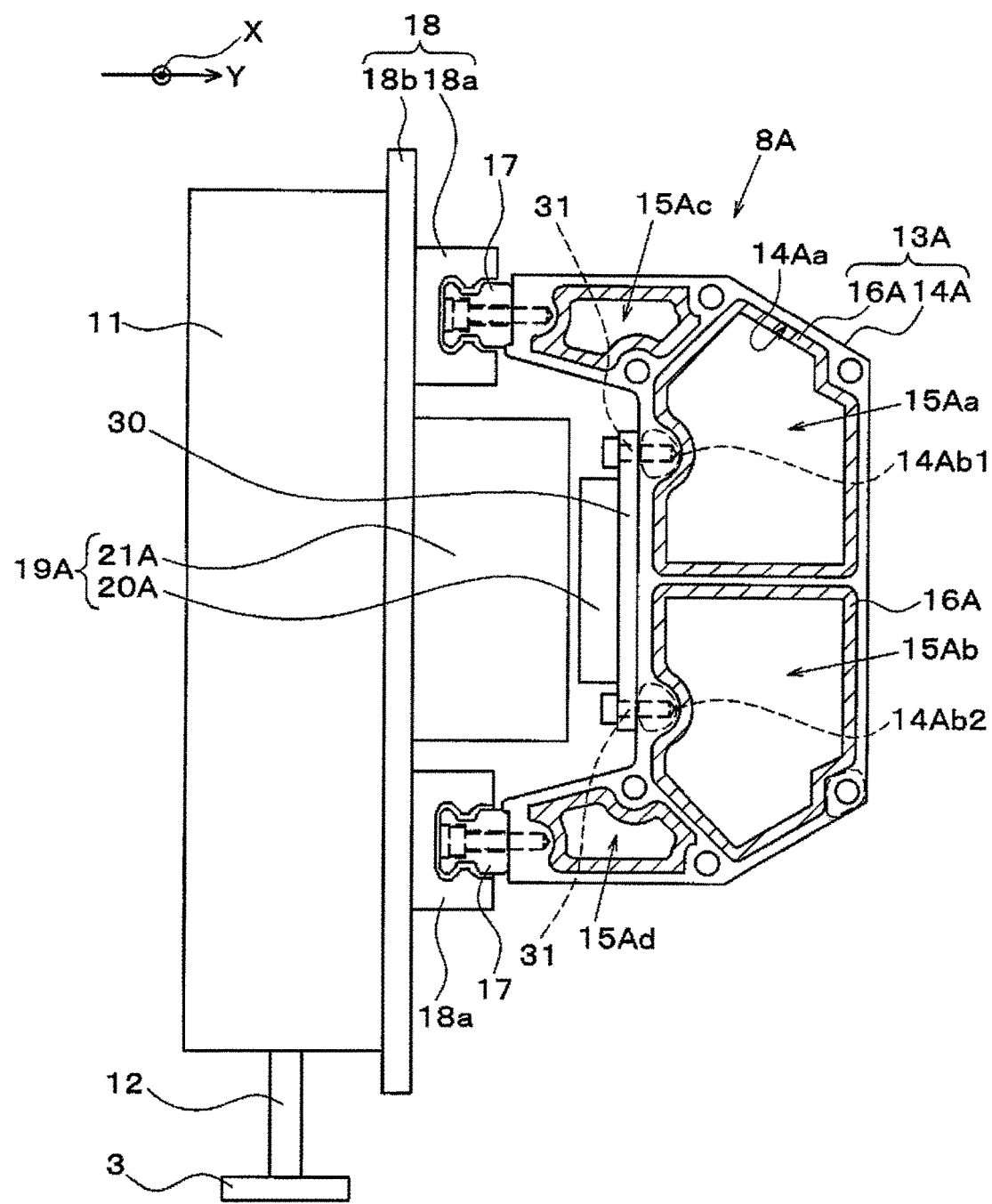
FIG. 5 is an explanatory drawing of the structure of a first linear motion mechanism that is provided in an electronic component mounting apparatus according to a second embodiment of the present invention.

According to FIG. 5, the beam 13A is provided with a tubular body 14A that is provided with opening portions 15Aa to 15Ad which penetrate the tubular body 14A in the X direction and has a substantially U-shaped cross section and tubular reinforcing portions 16A that are formed of a carbon fiber reinforced plastic and are formed in close contact with inner surfaces 14Aa of the tubular body 14A. In the tubular body 14A, a stator 20A that constitutes a linear motor 19A is attached at a position between an upper portion and a lower portion, which extend in the horizontal direction, on the attaching side for the mounting head 11. A mover 21A, which also constitutes the linear motor 19A, is attached at a position of the plate member 18b opposing to the stator 20A. The principle of the X-direction movement of the moving members 18 is as described in the first embodiment.

The tubular body 14A has a first thick portion 14Ab1 and a second thick portion 14Ab2 at respective positions where the stator 20A is pinched in the vertical direction on the attaching side for the mounting head 11.

Figure 6:
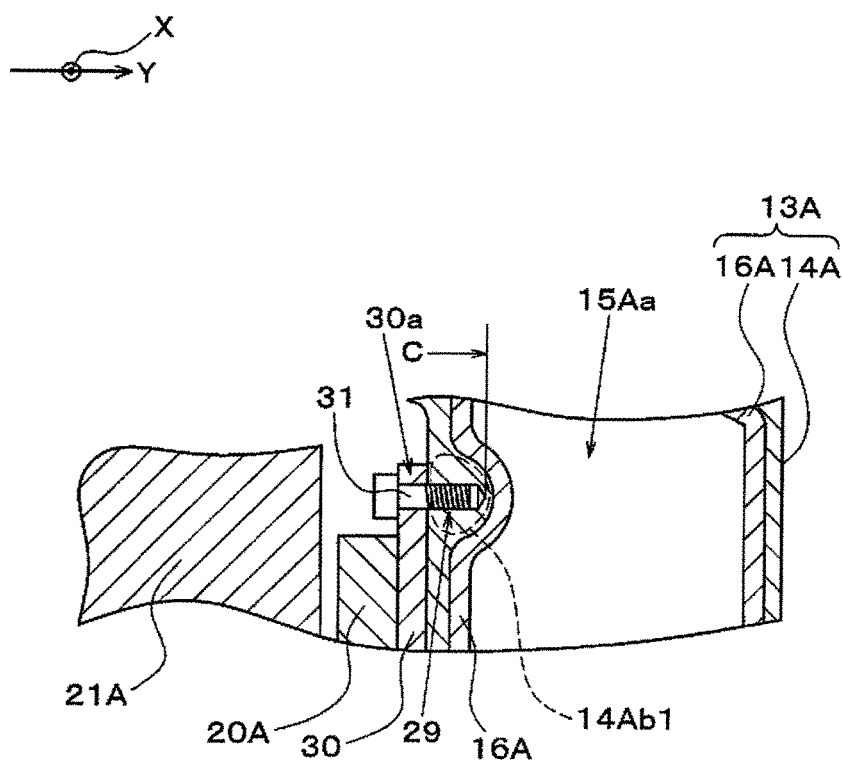
FIG. 6 is an explanatory drawing of a structure for fixing a stator and a beam constituting the first linear motion

Hereinafter, a structure for fixing the stator 20A to the beam 13A will be described with reference to FIG. 6. Although only the first thick portion 14Ab1 is illustrated in FIG. 6, the same description is applied to the second thick portion 14Ab2 as well. A screw hole 29 that has a screw groove is formed in the first thick portion 14Ab1. The bottom portion C of the screw hole 29 does not reach the tubular reinforcing portion 16A of the adjacent first opening portion 15Aa. In other words, the screw hole 29 has a bottom. The same description is applied to the site between the screw hole 29 and the tubular reinforcing portion 16A of the second opening portion 15Ab on the second thick portion 14Ab2 side.

The stator 20A is fixed to the beam 13A via a plate member 30 that extends in the longitudinal direction of the tubular body 14A. An insertion hole 30a for the insertion of a fourth screw member 31 is formed at a position of the plate member 30 corresponding to the first thick portion 14Ab1. The stator 20A is fixed to the beam 13A via the plate member 30 when the fourth screw member 31 is screwed with the screw hole 29 via the insertion hole 30a. The same description is applied to the second thick portion 14Ab2 side as well. Even in this second embodiment, the processing for the formation of the screw holes or the like can be easily performed while the tubular reinforcing portions 16A formed of the carbon fiber reinforced plastic are used.

The linear motion device and the electronic component mounting apparatus according to the present invention are not limited to those described in the first and second embodiments but can be modified without departing from the scope of the present invention. The screw hole may be formed so as to fix at least the guide member to the tubular body.

According to the embodiments, a beam to which processing for the formation of a screw hole or the like can be easily performed with a carbon fiber reinforced plastic used in bye beam can be obtained. The embodiments of the present invention are useful in the field of electronic component mounting.

What is claimed is:

1. A linear motion device comprising
a linear motion mechanism including:
a beam elongated in one horizontal direction;
a guide member disposed in the beam to extend in the one horizontal direction;
a moving member that is movable along the guide member; and
a moving mechanism that moves the moving member, wherein
the beam includes
a metallic tubular body formed with a plurality of opening portions penetrating the metallic tubular body in the one horizontal direction and
a plurality of tubular reinforcing portions formed in close contact with inner surfaces of the opening portions.

2. The linear motion device according to claim 1, wherein
the metallic tubular body has a thick portion and a thin portion formed to extend in the one horizontal direction, and
a screw hole, which is used to fix at least the guide member to the metallic tubular body by a screw member, is formed in the thick portion.

3. The linear motion device according to claim 2, wherein the screw hole has a bottom at the thick portion.

4. The linear motion device according to claim 1, wherein the tubular reinforcing portion is formed of a carbon fiber reinforced plastic being in close contact with the inner surfaces of the opening portions.

5. The linear motion device according to claim 4, wherein the tubular reinforcing portion is formed by an internal pressure molding method.

6. The linear motion device according to claim 4, wherein the tubular reinforcing portion is formed by pressing the carbon fiber reinforced plastic sheet against the inner surfaces of the opening portions and thermally curing the carbon fiber reinforced plastic sheet.

7. The linear motion device according to claim 1, wherein the tubular reinforcing portion extends about and is in close contact with an entire inner perimeter of the opening portion.

8. An electronic component mounting apparatus comprising:
an XY movement mechanism configured of a first linear motion mechanism and second linear motion mechanism,
the first linear motion mechanism including
a beam elongated in one horizontal direction,
a guide member disposed in the beam to extend in the one horizontal direction,
a moving member that is movable along the guide member, and
a moving mechanism that moves the moving member, the second linear motion mechanism moving the first linear motion mechanism in a second horizontal direction orthogonal to the one horizontal direction; and a mounting head attached to the moving member, wherein in the electronic component mounting apparatus, the mounting head holding an electronic component is positioned with respect to a substrate by the XY movement mechanism, and the electronic component is mounted on the substrate by the positioned mounting head, and the beam includes
- a metallic tubular body formed with a plurality of opening portions penetrating the metallic tubular body in the one horizontal direction and
- a plurality of tubular reinforcing portions formed in close contact with inner surfaces of the opening portions.

9. The electronic component mounting apparatus according to claim 8, wherein the metallic tubular body has a thick portion and a thin portion formed to extend in the one horizontal direction, and a screw hole, which is used to fix at least the guide member to the metallic tubular body by a screw member, is formed in the thick portion.

10. The electronic component mounting apparatus according to claim 9, wherein the screw hole has a bottom at the thick portion.

11. The electronic component mounting apparatus according to claim 8, wherein the tubular reinforcing portion is formed by a carbon fiber reinforced plastic being in close contact with the inner surfaces of the opening portions.

12. The electronic component mounting apparatus according to claim 11, wherein the tubular reinforcing portion is formed by an internal pressure molding method.

13. The linear motion device according to claim 11, wherein the tubular reinforcing portion is formed by pressing the carbon fiber reinforced plastic sheet against the inner surfaces of the opening portions and thermally curing the carbon fiber reinforced plastic sheet.

14. The linear motion device according to claim 8, wherein the tubular reinforcing portion extends about and is in close contact with an entire inner perimeter of the opening portion.

* * * * *